(12) United States Patent
Kaneko et al.

(10) Patent No.: US 8,393,845 B2
(45) Date of Patent: Mar. 12, 2013

(54) SUBSTRATE CONVEY PROCESSING DEVICE, TROUBLE COUNTERMEASURE METHOD IN SUBSTRATE CONVEY PROCESSING DEVICE, AND TROUBLE COUNTERMEASURES PROGRAM IN SUBSTRATE CONVEY PROCESSING DEVICE

(75) Inventors: Tomohiro Kaneko, Koshi (JP); Yoshitaka Hara, Koshi (JP); Akira Miyata, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 1033 days.

(21) Appl. No.: 11/813,925

(22) PCT Filed: Jan. 18, 2006

(86) PCT No.: PCT/JP2006/300576
§ 371 (c)(1),
(2), (4) Date: Jul. 13, 2007

(87) PCT Pub. No.: WO2006/077843
PCT Pub. Date: Jul. 27, 2006

(65) Prior Publication Data
US 2009/0016860 A1 Jan. 15, 2009

(30) Foreign Application Priority Data
Jan. 21, 2005 (JP) .................................. 2005-013481

(51) Int. Cl.
*B65H 1/00* (2006.01)
(52) U.S. Cl. ..................... 414/222.02; 414/217; 414/937
(58) Field of Classification Search .................. 414/217, 414/222.01, 222.02, 222.08, 222.11, 935, 414/937, 222.13
See application file for complete search history.

(56) References Cited

U.S. PATENT DOCUMENTS

| | | | | |
|---|---|---|---|---|
| 5,308,210 A | * | 5/1994 | Ohtani et al. | 414/222.07 |
| 5,700,127 A | * | 12/1997 | Harada et al. | 414/416.08 |
| 5,841,515 A | * | 11/1998 | Ohtani | 355/27 |
| 6,275,744 B1 | * | 8/2001 | Yoshida | 700/218 |
| 6,837,632 B2 | * | 1/2005 | Koyama et al. | 396/611 |

(Continued)

FOREIGN PATENT DOCUMENTS

| | | |
|---|---|---|
| JP | 4 80940 | 3/1992 |
| JP | 6-151293 | 5/1994 |
| JP | 9 50948 | 2/1997 |
| JP | 9-306971 | 11/1997 |

(Continued)

*Primary Examiner* — Saul Rodriguez
*Assistant Examiner* — Glenn Myers
(74) *Attorney, Agent, or Firm* — Oblon, Spivak, McClelland, Maier & Neustadt, L.L.P.

(57) ABSTRACT

A plurality of process modules for conducting processes on a wafer; conveying modules for conveying the wafer, a turnout module for transferring the wafer to/from the conveying module, and a CPU for detecting a trouble occurring in the process module and centrally controlling each of the modules based on a detection signal. When the controller detects the trouble occurring in any one of the process modules, the wafer to be conveyed to the process module where the trouble occurs is conveyed to the turnout module, and conveyance of the wafer before the process module where the trouble occurs is temporarily stopped, and conveyance and processing of the other wafer are continued, and thereafter, conveyance and processing of the wafer before the process module where the trouble occurs are conducted.

7 Claims, 9 Drawing Sheets

U.S. PATENT DOCUMENTS

| | | | |
|---|---|---|---|
| 7,231,273 B2 * | 6/2007 | Nishimura et al. | 700/112 |
| 7,406,360 B2 * | 7/2008 | Machiyama | 700/112 |
| 2002/0153027 A1 * | 10/2002 | Itou | 134/18 |
| 2004/0018745 A1 * | 1/2004 | Tashiro et al. | 438/758 |
| 2004/0105737 A1 * | 6/2004 | Ozawa et al. | 414/217 |
| 2004/0151562 A1 * | 8/2004 | Hofmeister et al. | 414/217 |
| 2005/0130453 A1 * | 6/2005 | Inada et al. | 438/800 |

FOREIGN PATENT DOCUMENTS

| | | |
|---|---|---|
| JP | 11 16983 | 1/1999 |
| JP | 2000-94233 | 4/2000 |
| JP | 2002 252263 | 9/2002 |
| JP | 2005-11936 | 1/2005 |

* cited by examiner

FIG.3
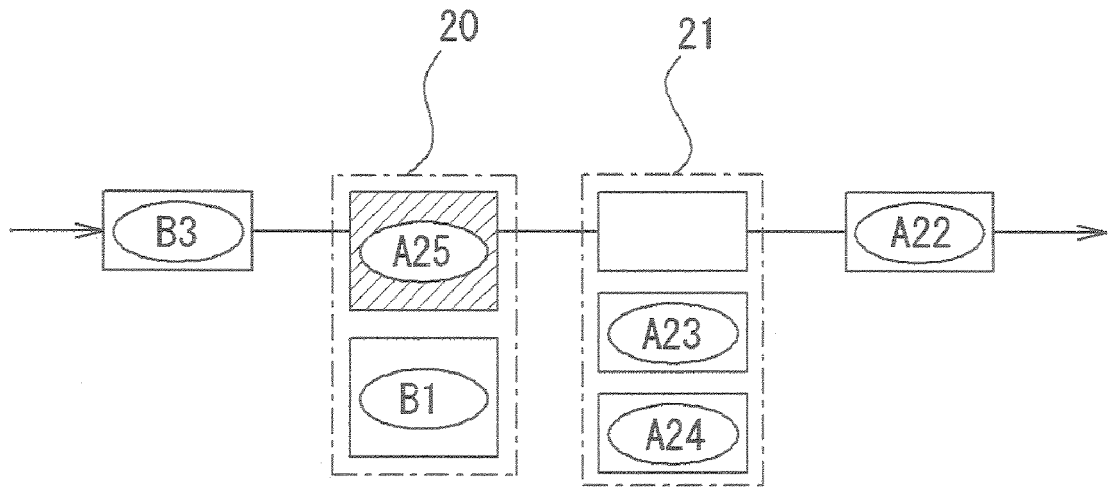
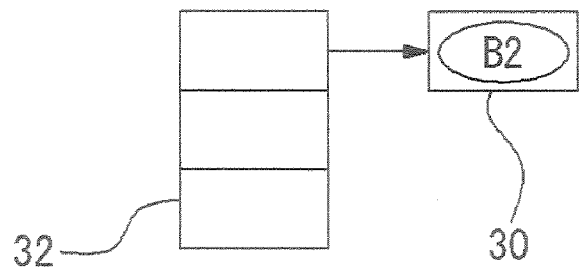
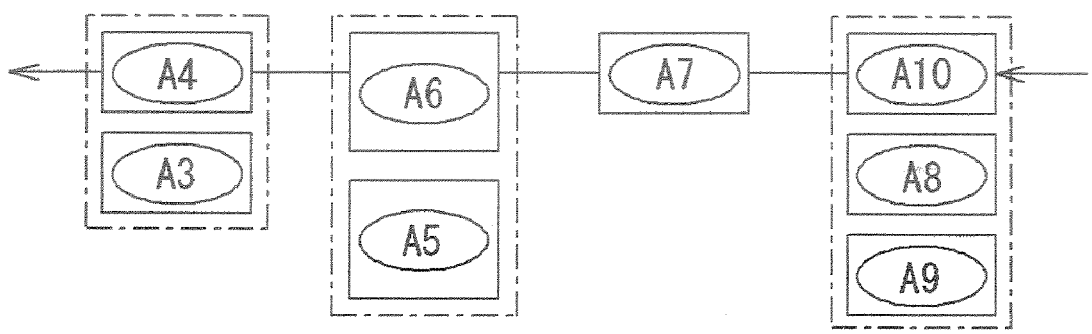

FIG.4
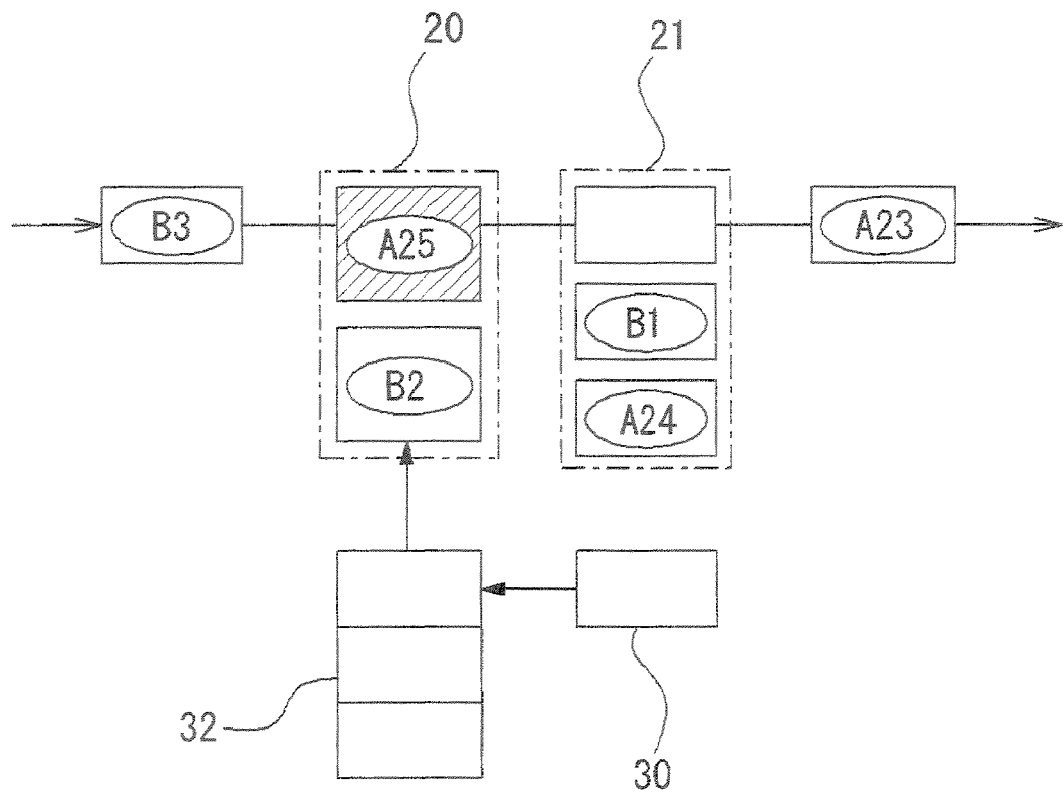
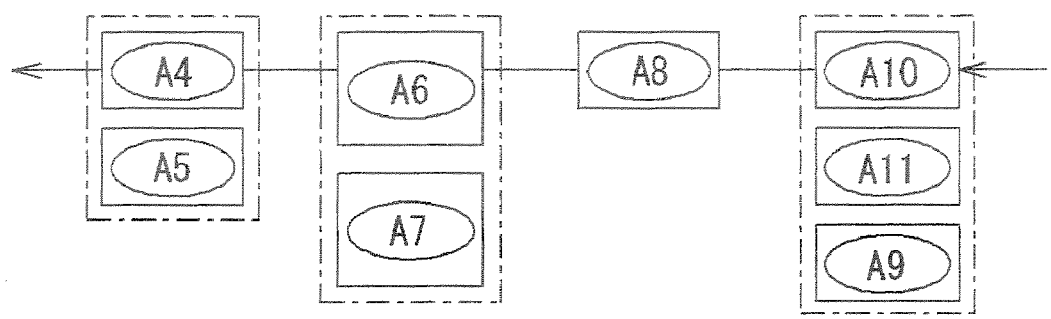

FIG.5
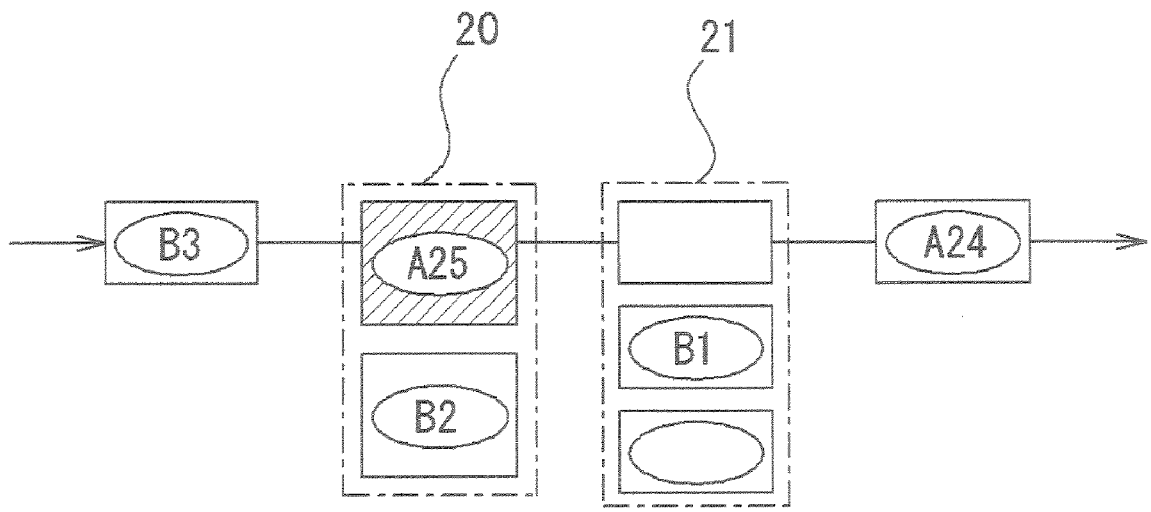
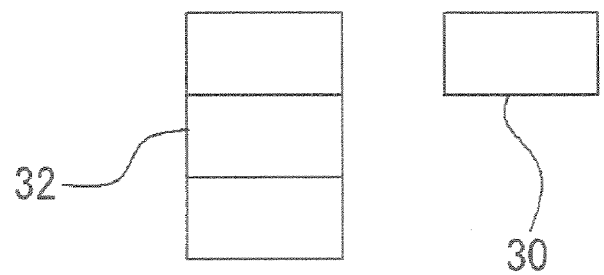
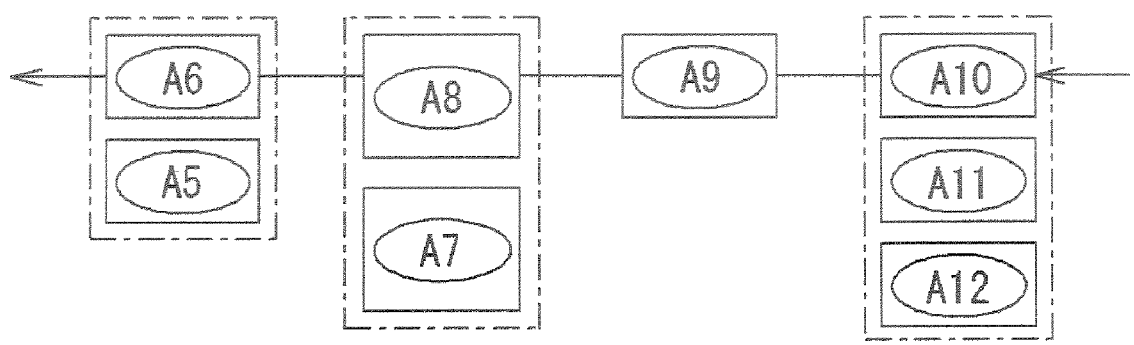

FIG.6
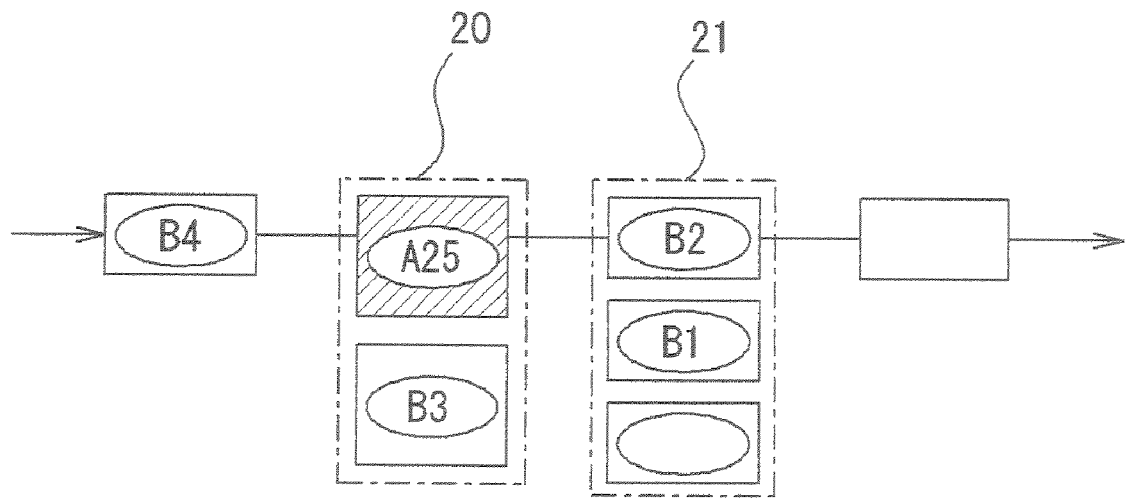
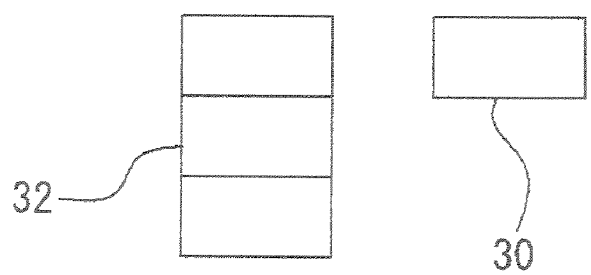
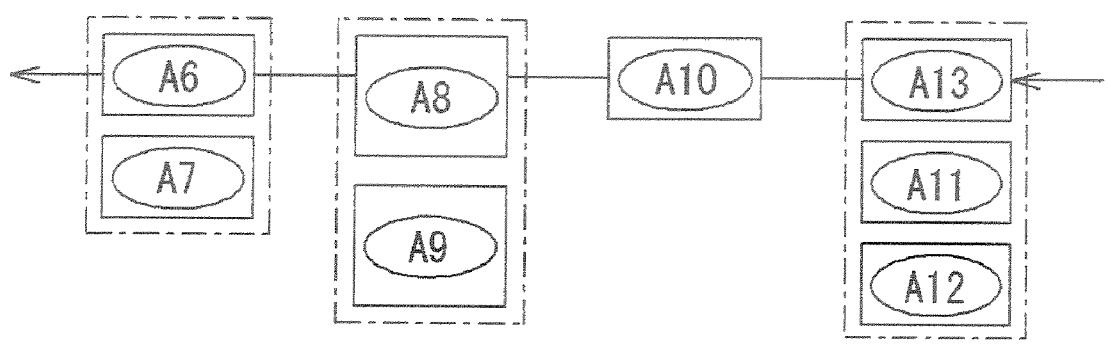

SUBSTRATE CONVEY PROCESSING DEVICE, TROUBLE COUNTERMEASURE METHOD IN SUBSTRATE CONVEY PROCESSING DEVICE, AND TROUBLE COUNTERMEASURES PROGRAM IN SUBSTRATE CONVEY PROCESSING DEVICE

TECHNICAL FIELD

The present invention relates to substrate convey processing devices which conduct processes on substrates such as semiconductor wafers or LCD glass substrates, in a distributed manner, with use of a plurality of process modules, and more specifically, to a substrate convey processing device with a countermeasure for a situation where a trouble occurs in any one of such process modules.

BACKGROUND ART

Generally, in production of a substrate such as semiconductor wafer or LCD (Liquid Crystal Display), the photolithography technique is utilized for forming a thin film of ITO (Indium Tin Oxide) or an electrode pattern on the substrate. The photolithograph technique employs a substrate convey processing device in which a substrate is conveyed to a plurality of process modules where photoresist is applied to the substrate to be exposed to light for a development process thereafter.

This type of substrate convey processing device includes a carrying-in cassette module for accommodating a plurality of unprocessed substrates, a plurality of process modules for executing predetermined processes on the substrates, a carrying-out cassette module for accommodating the processed substrates, and a conveying module for conveying the substrates between each of the modules, and is so designed that the substrates from the carrying-in cassette module are conveyed to each of the process modules in a distributed manner by the conveying module, and the substrates are processed in the plurality of process modules in a distributed manner.

Conventionally, in this type of substrate convey processing device, when a trouble occurs in a certain module while the substrate is being conveyed to each module in a stage of processing substrates in the plurality of process modules in a distributed manner, a conveyance destination of the substrate under conveyance is changed to another normally-operating module, whereby conveyance of any other substrates in the device is prevented from stopping due to occurrence of the trouble in the certain module (see, for example, Japanese Patent Laying-Open No. 9-050948 (Patent Document 1), Japanese Patent Laying-Open No. 11-016983 (Patent Document 2)).

Patent Document 1 Japanese Patent Laying-Open No. 9-050948

Patent Document 2: Japanese Patent Laving-Open No. 11-016983

DISCLOSURE OF THE INVENTION

Problems to be Solved by the Invention

However, in the stage of processing the substrates in a distributed manner process time is sometimes very long. Therefore, when the conveyance destination of the substrate under conveyance is changed to another normally-operating module in response to occurrence of the trouble in the certain module, there arises a problem that substrate conveyance is delayed until the process of the certain module ends.

Further, delay in conveyance of the substrate leads to a problem that variation occurs in cycle time controls and production yield is deteriorated.

The present invention was devised in consideration of the above problems, and it is an object of the present invention to provide a substrate convey processing device and a trouble countermeasure method therefor, and a trouble countermeasures program which allow smooth execution of conveyance and processing of a substrate, keeping cycle time control, and improvement in production yield even when a trouble occurs in some of modules.

Means for Solving the Problems

In order to solve the above problems, a substrate convey processing device of the present invention includes a carrying-in cassette module for accommodating a plurality of unprocessed substrates to be processed, a plurality of process modules for conducting predetermined processes on the substrate to be processed, a carrying-out cassette module for accommodating the processed substrates, and conveying modules for conveying the substrate to be processed between each of the modules, in which the substrate to be processed from the carrying-in cassette module is conveyed to each of the process modules in a distributed manner by the conveying module, and the substrate to be processed is processed by each of the plurality of process modules in a distributed manner, and the substrate convey processing device further includes: a turnout module for transferring the substrate to be processed to/from the conveying module, and a controller for detecting a trouble occurring in the process module and centrally controlling each of the modules based on a detection signal, wherein when the controller detects a trouble occurring in any one of the process modules, the substrate to be processed to be conveyed to the process module where the trouble occurs is conveyed to the turnout module, and conveyance of the substrates to be processed before the process module where the trouble occurs is temporarily stopped and conveyance and processing of other substrates to be processed are continued, and thereafter, conveyance and processing of the substrates to be processed before the process module where the trouble occurs are conducted.

Further, a trouble countermeasure method of the present invention is a trouble countermeasure method in a substrate convey processing device which includes: a carrying-in cassette module for accommodating a plurality of unprocessed substrates to be processed; a plurality of process modules for conducting predetermined processes on the substrate to be processed; a carrying-out cassette module for accommodating the processed substrates; and conveying modules for conveying the substrate to be processed between each of the modules, in which the substrate to be processed from the carrying-in cassette module is conveyed to each of the process modules in a distributed manner by the conveying module, and the substrate to be processed is processed by each of the plurality of process modules in a distributed manner, and the trouble countermeasure method includes the steps of detecting a trouble occurring in any one of the process modules; conveying the substrate to be processed to be conveyed to the process module where the trouble occurs to a turnout module for transferring the substrate to be processed to/from the conveying module based on a signal detected by the controller; temporarily stopping conveyance of the substrates to be processed before the process module where the trouble occurs; continuing conveyance and processing of the substrates to be processed after the process module where the trouble occurs; and thereafter conducting conveyance and processing of the substrates to be processed before the process module where the trouble occurs, by a controller for centrally controlling each of the modules.

In the present invention, the turnout module may be any module to which the substrate to be processed to be conveyed to the process module where the trouble occurs can be conveyed, and may be any one of e.g., a transfer module which is disposed between blocks having a plurality of modules and transfers the substrate to be processed between the adjacent blocks, a buffer module which is disposed in the block having the plurality of modules and capable of transferring the substrate to be processed in the block, or an unused vacant module, as well as a separately provided module.

A trouble countermeasures program of the present invention executes the trouble countermeasure method, and is a trouble countermeasures program in a substrate convey processing device which includes: a carrying-in cassette module for accommodating a plurality of un-processed substrates to be processed; a plurality of process modules for conducting predetermined processes on the substrate to be processed; a carrying-out cassette module for accommodating the processed substrates; and conveying modules for conveying the substrate to be processed between each of the modules, in which the substrate to be processed from the carrying-in cassette module is conveyed to each of the process module in a distributed manner by the conveying module, and the substrate to be processed is processed by each of the plurality of process modules in a distributed manner, and the trouble countermeasures program causes a computer to execute the procedures of detecting a trouble occurring in any one of the process modules; conveying the substrate to be processed to be conveyed to the process module where the trouble occurs to a turnout module for transferring the substrate to be processed to/from the conveying module based on the detection signal; temporarily stopping conveyance of the substrates to be processed before the process module where the trouble occurs; continuing conveyance and processing of the substrates to be processed after the process module where the trouble occurs; and thereafter conducting conveyance and processing of the substrates to be processed before the process module where the trouble occurs.

With the configuration as described above, when the trouble occurs in any one of the process modules in a state where the substrate to be processed from the carrying-in cassette module is conveyed to each of the process modules in a distributed manner by the conveying module, and the substrate to be processed is processed in each of the plurality of process modules in a distributed manner, the trouble is detected by the controller. Then, according to the detected signal, the controller conveys the substrate to be processed to be conveyed to the process module where the trouble occurs to the turnout module for transferring the substrate to be processed to/from the conveying module, and conveyance of the substrates to be processed before the process module where the trouble occurs is temporarily stopped, and conveyance and processing of the substrates to be processed after the process module where the trouble occurs are continued. Thereafter, conveyance and processing of the substrates to be processed before the process module where the trouble occurs may be conducted.

Effects of the Invention

Since the present invention has the configuration as described above, the following effects are obtained. According to the present invention, the substrate to be processed to be conveyed to the process module where the trouble occurs is conveyed to the turnout module, conveyance of the substrates to be processed before the process module where the trouble occurs is temporarily stopped, conveyance and processing of the substrates to be processed after the process module where the trouble occurs are continued, and thereafter, conveyance and processing of the substrates to be processed before the process module where the trouble occurs may be conducted. Therefore, even when the trouble occurs in part of the modules, it is possible to conduct conveyance and processing of the substrates to be processed smoothly, keep cycle time control, and improve production yield.

Further, according to the present invention, by realizing the turnout module with the transfer module disposed between the blocks having the plurality of modules, for transferring the substrate to be processed between the adjacent blocks, it is possible to share the existent transfer module provided in the device, and to further downsize the device.

Further, according to the present invention, by realizing the turnout module with the buffer module disposed in the block having the plurality of modules, and capable of transferring the substrate to be processed in the block, it is possible to share the existent buffer module provided in the device, and to further downsize the device.

Furthermore, according to the present invention, by realizing the turnout module with an unused vacant module, it is possible to share the existent module provided in the device, and to further downsize the device.

BRIEF DESCRIPTION OF THE DRAWINGS

FIG. 3 is a schematic plan view showing a state where a wafer is conveyed to a turnout module in the present invention.

FIG. 4 is a schematic plan view showing a state where the wafer is conveyed to a normally-operating application module from the turnout module.

FIG. 5 is a schematic plan view showing a state where conveyance of the wafer before the application module where the trouble occurs is stopped, and conveyance and processing of the wafer after the same are continued.

FIG. 6 is a schematic plan view showing a state where conveyance and processing of the wafer before the application module where a trouble occurs are continued.

DESCRIPTION OF THE REFERENCE SIGNS

1: carrying-in cassette module, 2: carrying-out cassette module 4: processing part, 4A: first processing block, 4B: second processing block, 5: exposure part, 6: first interface part, 7: second interface part, 11: first transfer module, 12: second transfer module, 13: third transfer module, 20: application module process module), 21: first oven module (process module), 22: second oven module (process module), 23: development module (process module), 30: turn-out module, 31: first conveying module, 32: second conveying module, 33: third conveying module, 34: fourth conveying module, 40: circumference exposure module (process module), 50: buffer module, 60: CPU (controller).

BEST MODES FOR CARRYING OUT THE INVENTION

In the following, the best mode for carrying out the present invention will be described in detail based on the attached drawings. Here, description will be made for a case where a substrate convey processing device according to the present invention is applied to a resist application, exposure and development processing system of a semiconductor wafer.

Figure 1:
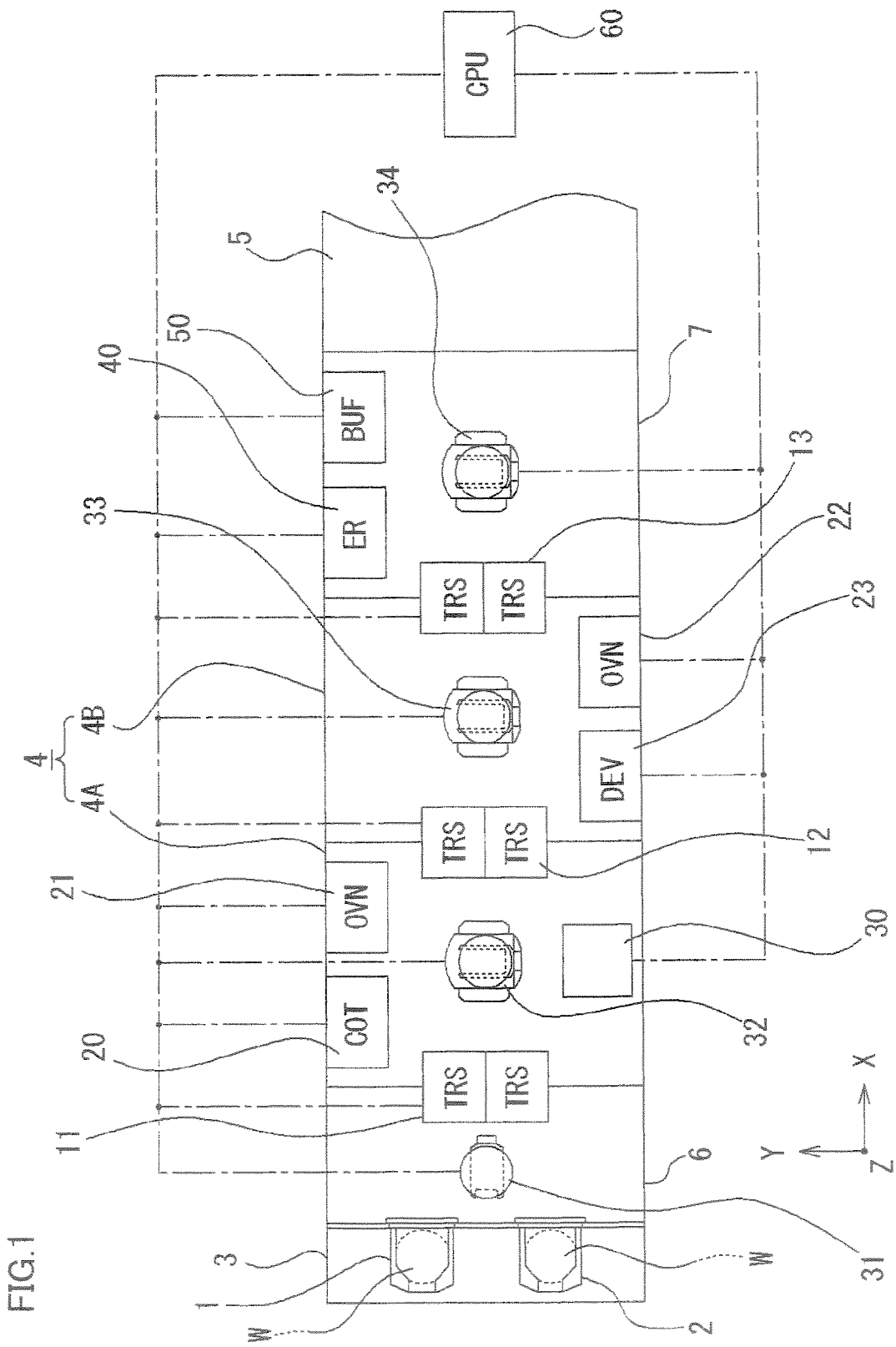
FIG. 1 is a schematic plan view showing a first embodiment of a resist application, exposure and development processing system having a substrate convey processing device according to the present invention.

FIG. 1 is a schematic plan view showing the resist application, exposure and development processing system of the semiconductor wafer in which the substrate convey processing device according to the present invention is applied.

As shown in FIG. 1, the resist application, exposure and development processing system (hereinafter, referred to as "processing system") has a carrying-in carrying-out part 3 having a carrying-in cassette module 1 for accommodating a plurality of semiconductor wafers W (hereinafter, referred to as "wafer W") which are un-processed substrates to be processed, and a carrying-out cassette module 2 for accommodating processed wafers W, provided in parallel to each other, a processing part 4 having a plurality of process modules as will be described later for conducting predetermined processes on wafer W, an exposure part 5, a first interface part 6 as a block disposed between carrying-in carrying-out part 3 and processing part 4, and a second interface part 7 as a block disposed between processing part 4 and exposure par 3.

The processing part 4 includes a first processing block 4A disposed sequentially from first interface part 6 via a first transfer module (TRS) 11, and a second processing block 4B disposed sequentially from second interface part 7 via a third transfer module (TRS) 13, and first processing block 4A and second processing block 4B are disposed sequentially with each other via a second transfer module (TRS) 12. Each of first, second and third transfer modules 11, 12, 13 has a transferring part for wafer W carried out from carrying-in cassette module 1 and conveyed to exposure part 5, and a transferring par for wafer W conveyed from exposure part 5 to carrying-out cassette module 2, arranged in parallel to each other.

The first processing block 4A has a multiple (e.g., double) application module (COT) which are process modules for applying resist to wafer W, a multiple (e.g., triple) first oven module (OVN) 21 which are process modules for conducting pre-bake process on wafer W after resist application, a horizontal second conveying module 32 which is movable in horizontal X, Y directions and vertical Z direction, for conveying wafer W between application module 20 and first oven module 21, and a turnout module 30 capable of transferring wafer W to/from second conveying module 32.

On the other hand, the second processing block 4B has a multiple second oven module (OVN) 22 which are process modules for conducting post exposure bake process aiming at preventing occurrence of fringe of wafer W after exposure process or at inducing acid catalytic reaction in chemical amplification type resist, and conducting post-bake process on wafer W after development process, a development module (DEV) 23 which is a process module for conducting development process on wafer W, and a third conveying module 33 which is movable in horizontal X, Y directions and vertical Z direction, for conveying wafer W between development module 23 and second oven module 22.

Further, first interface part 6 is provided with a first conveying module 31 which is movable in horizontal X, Y directions and vertical Z direction. By means of first conveying module 31, unprocessed wafer W accommodated in carrying-in cassette module 1 is taken out, and conveyed to one of the transferring parts of first transfer module 11, while processed wafer W residing in the other of the transferring parts of first transfer module 11 is received and conveyed (accommodated) in carrying-out cassette module 2.

Further, the second interface part 7 is provided with a circumference exposure module 40 for removing resist in the circumference of wafer W on which resist is applied, a buffer module 50 for temporarily waiting for wafer W which is transferred to/from exposure part 5, and a fourth conveying module 34 which is movable in horizontal X, Y directions and vertical Z direction, for transferring wafer W between circumference exposure module 40, and buffer module 50 and exposure part 5.

In the processing system configured as described above, application module 20, development module 23, first and second oven modules 21, 22 and the like process modules, first to fourth conveying modules 31 to 34, turnout module 30 and any other modules are electrically connected to a central processing unit (CPU) 60 (hereinafter, referred to as CPU 60) of a computer which is a controller, and every module is centrally controlled by CPU 60. In other words, a measure is taken so that a trouble occurring in an individual module is detected by a program that executes a convey schedule and a processing schedule stored in CPU 60, or selection or switching (changing) of these schedules, and convey steps and processing steps of wafer W are controlled in an optimum way based on a detection signal, as will be described later.

According to the processing system configured as described above, based on control signals for executing a convey schedule and a processing schedule stored in CPU 60, or selection or switching (changing) of these schedules, wafer W is processed in the steps (procedure) as will be described below.

First, first conveying module 31 provided in first interface part 6 takes out un-processed wafer W accommodated in carrying-in cassette module 1, and the taken out wafer W is conveyed to first transfer module 11. Then second conveying module 32 disposed in first processing block 4A takes wafer 7 out of first transfer module 11, and carrying the same into double application module 20 sequentially. Inside application module 20, resist is applied on surface of wafer W in a uniform thickness.

Upon application of resist, second conveying module 32 carries out wafer W from application module 20, and sequentially carrying it into triple first oven module 21. Inside first oven module 21, wafer W is subjected to pre-bake process for a predetermined time at predetermined temperature, e.g., at 100° C. As a result, residual solvent is removed by evaporation from resist film on wafer W.

Upon completion of pre-bake, second conveying module 32 carries water W out of first oven module 21, and conveys it to second transfer module 12. Then third conveying module 33 disposed in second processing block 4B takes wafer W out of second transfer module 12 and conveys it to third transfer module 13. Wafer W conveyed to third transfer module 13 is taken out by fourth conveying module 34 disposed in second interface part 7 and carried into circumference exposure module 40 where wafer W undergoes exposure process in its edge part.

Upon completion of circumference exposure process, fourth conveying module 34 takes wafer W out of circumference exposure module 40, and carries it into exposure part 5.

Upon completion of exposure process in exposure part 5, fourth conveying module 34 receives wafer W from inside exposure part 5, and conveys the received wafer W to third transfer module 13. Then third conveying module 33 receives wafer W from third transfer module 13 and carries it into post-exposure oven (not shown) in second oven module 22. Inside post-exposure oven, wafer W is subjected to post exposure bake process for a predetermined time at predetermined temperature, e.g., at 120° C. This prevents occurrence of fringe, and induces acid catalytic reaction in chemical amplification type resist. Therefore, accurate control is required so that time lag will not occur from exposure process to post exposure bake. Although the present description is made for a case where post exposure oven is incorporated into second oven module 22 in second processing block 4B, the post-exposure oven may be disposed inside second interface part 7.

Thereafter, wafer W is carried sequentially into double development module 23 by third conveying module 33. Inside development module 23, development process is conducted while a developing agent is applied uniformly on resist on the surface of wafer W. Upon completion of development, the developing agent is washed out by application of rinsing liquid on the surface of wafer W.

Upon completion of development step, third conveying module 33 carries wafer W out of development module 23 and then carries it into multiple second oven module 22 sequentially. Inside second oven module 22, wafer W is subjected to post bake process for a predetermined time, for example, at 100° C. As a result, resist that is swelled during development is cured and chemical resistance is improved.

Upon completion of post bake, third conveying module 33 carries processed wafer W out of second oven module 22, and conveys it to second transfer module 12. As wafer W is conveyed to second transfer module 12, second conveying module 32 receives wafer W from second transfer module 12 and conveys wafer W to first transfer module 1. Then first conveying module 31 receives wafer W from first transfer module 11 and conveys it serially into carrying-out cassette module 2, and ends the process.

Next, one exemplary countermeasure against trouble in the processing system will be described with reference to FIGS. 2 to 6 and flowchart of FIG. 9. Here, description will be made for a case where a trouble occurs in application module 20 of first processing block 4A during conveyance and processing of an A rot (A1 to A25) and a B rot (B1 to B25) each including 25 wafers W.

Figure 2:
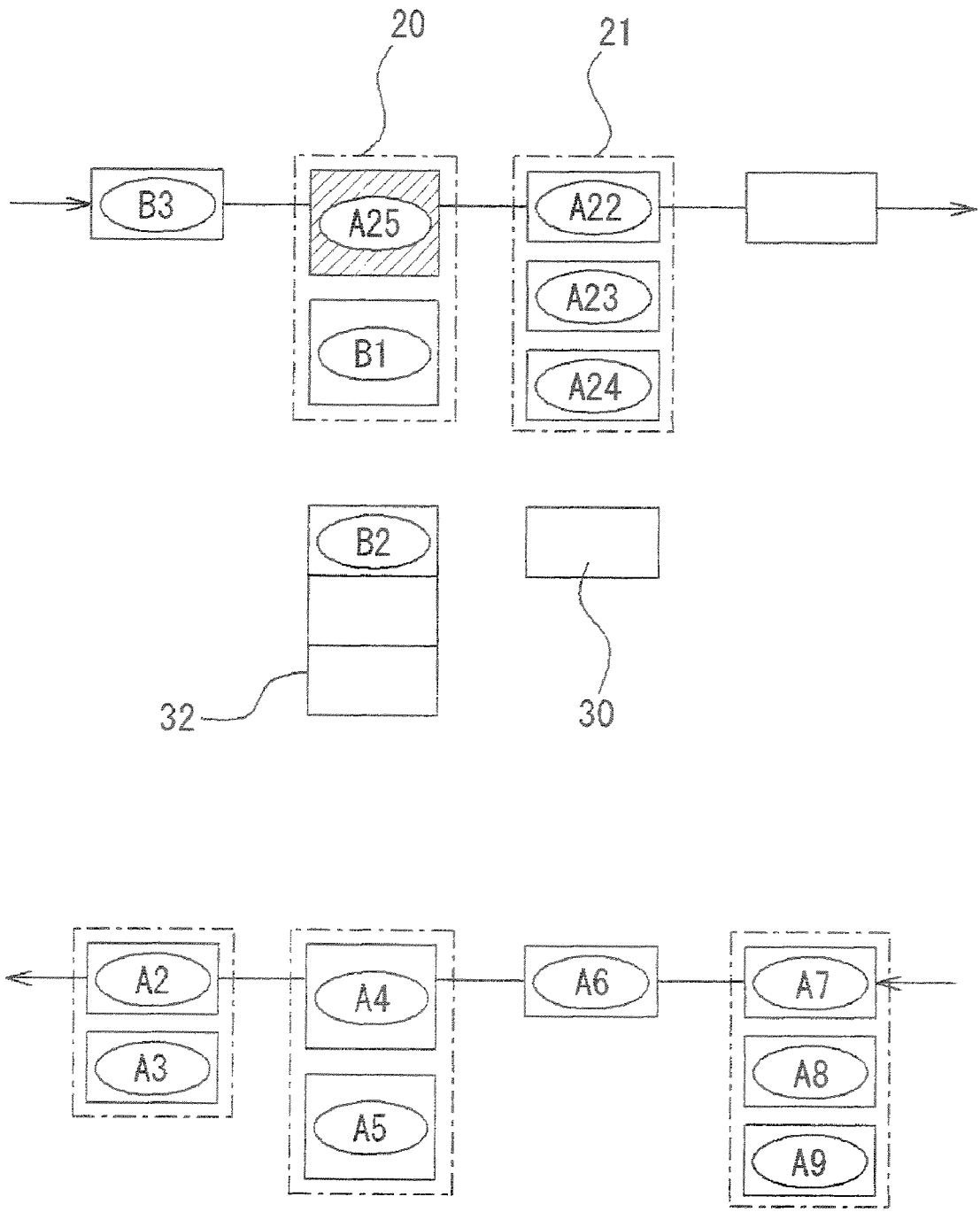
FIG. 2 is a schematic plan view showing a state where a trouble occurs in an application module as a process module in the present invention.

First, for example, when a trouble occur at last wafer W (A25) of A rot which is being processed in one unit of double application module 20, occurrence of trouble is detected by a scanning signal of CPU 60, namely a check signal for conveyance exclusion (FIG. 9, Step 9-1) {FIG. 2 (FIG. 9, Step 9-2)}. Then whether or not conveyance to the application module 20 of a conveyance destination is being executed is determined (FIG. 9, Step 9-3) In the present case, since conveyance of second wafer W (B2) in B rot to application module 20 is not conducted by second conveying module 32, turnout module 30 is determined as the conveyance destination of wafer W (B2) (FIG. 9, Step 9-4). Then whether or not turnout module 30 is useable is determined (FIG. 9, Step 9-6), and if turnout module 30 is useable, convey schedule is changed, and the conveyance destination is changed to turnout module 30 (FIG. 9, Step 9-7), and wafer W (B2) is conveyed to turnout module 30 by second conveying module 32 (see FIG. 3). While wafer W (B2) is conveyed to turnout module 30, conveyance of third wafer W (B3) in B rot before application module 20 where the trouble occurs is temporarily stopped. Conveyance and processing of other wafers W are continued (FIG. 9, Step 9-10).

Thereafter, convey schedule is switched, and first wafer W (B1) in B rot inside normal y-operating application module 20 is subjected to application process, and carried into first oven module 21 by second conveying module 32. Then second conveying module 32 receives wafer W (B2) from turnout module 30 and carries it into normally-operating application module 20 (see FIG. 4). Thereafter, as twenty-fourth wafer W (A24) in A rot processed inside first oven module 21 is taken out of first oven module 21 (see FIG. 5), wafer W (B2) having subjected to application process by normally-operating application module 20 is carried into first oven module 21 by second conveying module 32, and then wafer W (B3) for which convey is temporarily stopped is carried into normally-operating application module 20 by second conveying module 32 (see FIG. 6).

Figure 9:
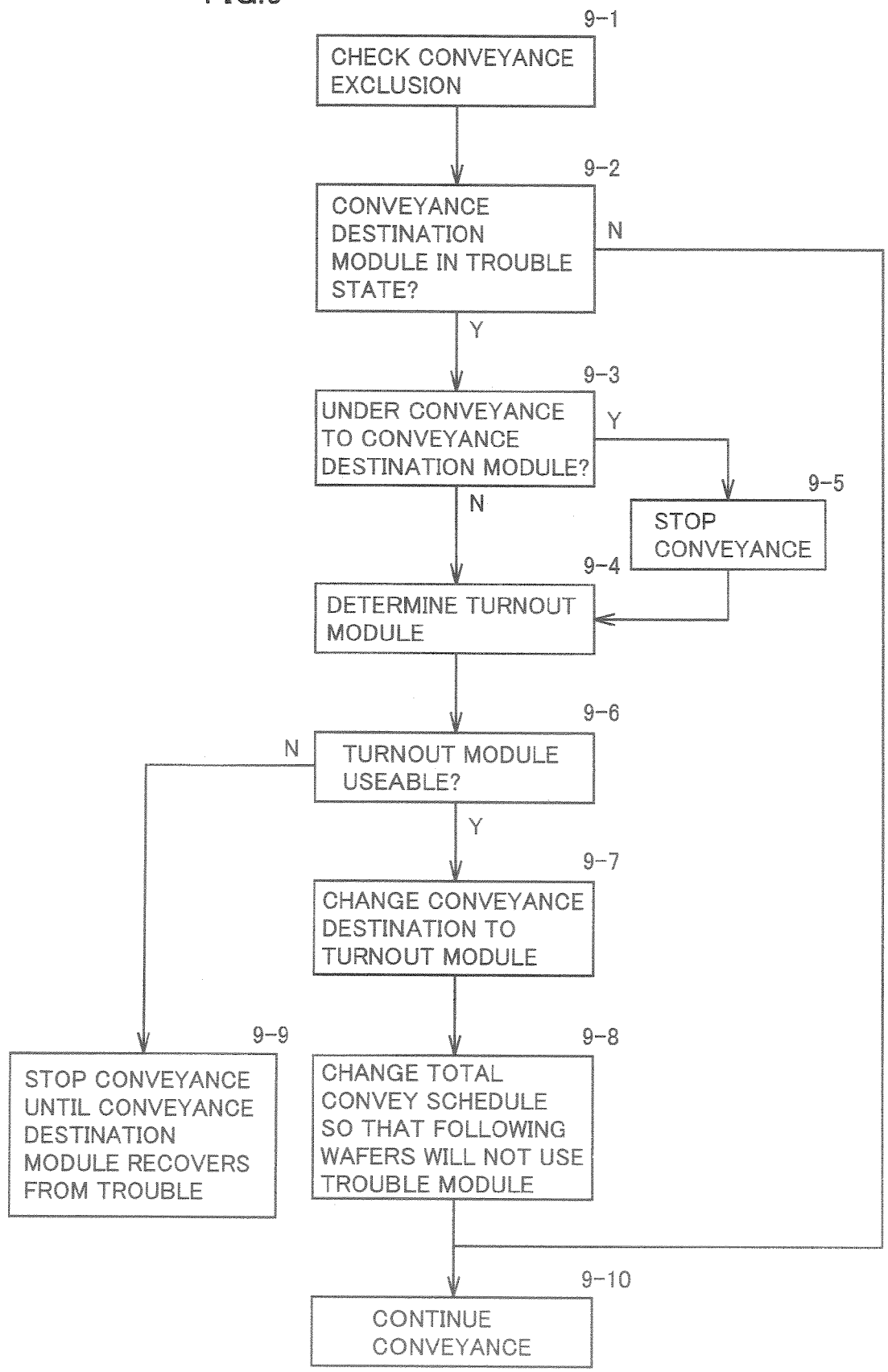
FIG. 9 is a flowchart showing procedures of a trouble countermeasure method in the present invention.

During conveyance to the conveyance destination module (application module 20), turnout module 30 is determined as the conveyance destination after stopping conveyance (FIG. 9, Step 9-5). When turnout module 30 is not useable, conveyance is stopped until the conveyance destination module (application module 20) returns from trouble (FIG. 9, Step 9-9).

Figure 7:
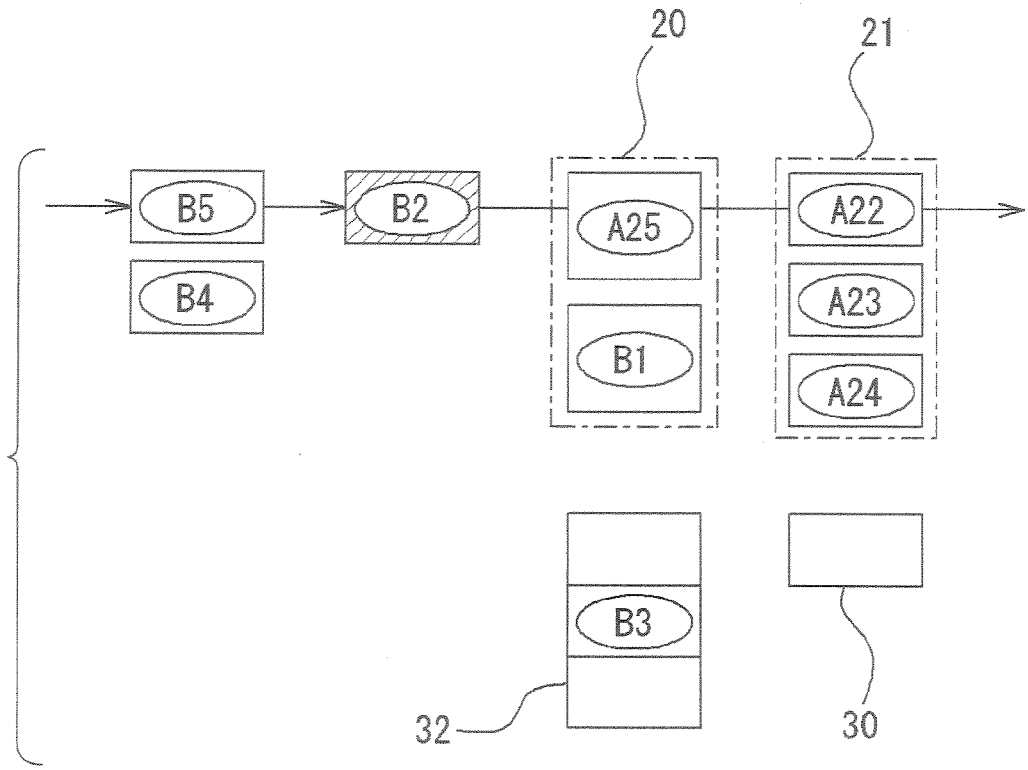
FIG. 7 is a schematic plan view showing a state where the trouble occurs in a single module in the present invention.
Figure 8:
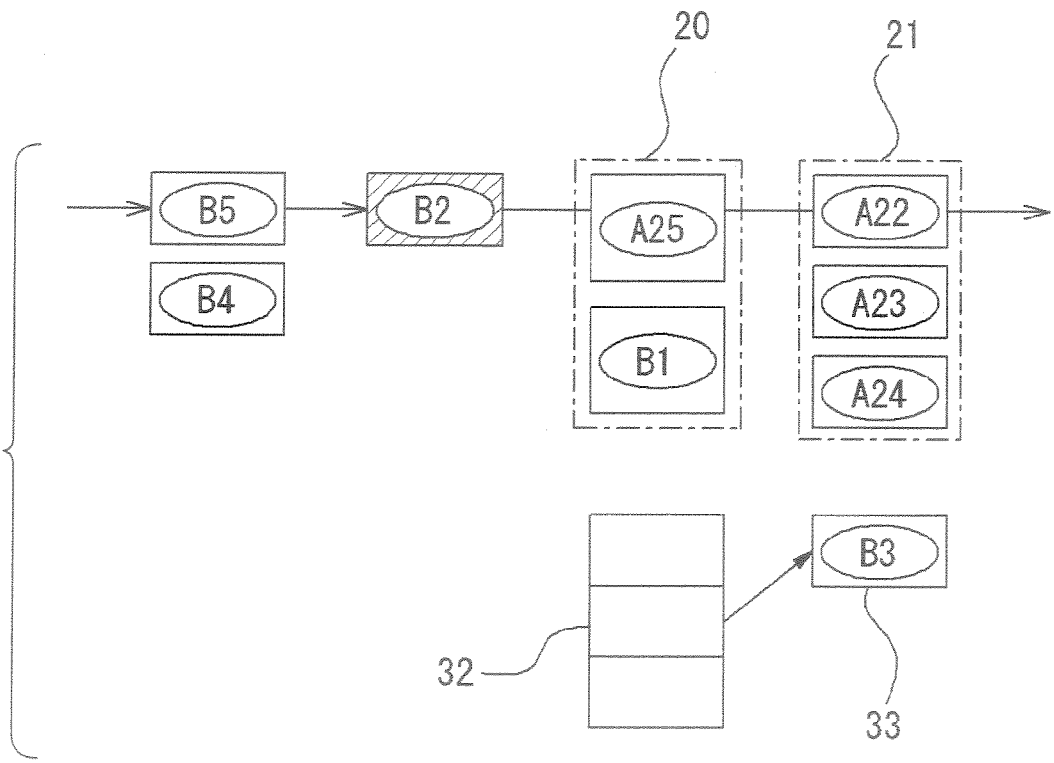
FIG. 8 is a schematic plan view showing a state where the wafer is conveyed to the turnout module in a case where the trouble occurs in the single module.

Although the above description is made for a case where a trouble occurs in one unit of application module 20 including a plurality of process modules, similar countermeasure against trouble may be employed in a case where a trouble occurs in a single module. For example, as shown in FIG. 7, when a trouble occurs in a module of preceding step of second conveying module 32, occurrence of trouble is detected (FIG. 9, Step 9-2) by scanning signal of CPU 60, namely checking signal of conveyance exclusion (FIG. 9, Step 9-1). Then whether or not conveyance to application module 20 which is the conveyance destination is being executed is determined (FIG. 9, Step 9-3). In the present case, since wafer W (B3) in B rot is not conveyed to application module 20 by second conveying module 32, turnout module 30 is determined as the conveyance destination of wafer W (B3) (FIG. 9, Step 9-4). Then whether or not turnout module 30 is useable is determined (FIG. 9, Step 9-6), and if turnout module 30 is useable, convey schedule is changed, and the conveyance destination is changed to turnout module 30 (FIG. 9, Step 9-7), and wafer W (B3) is conveyed to turnout module 30 by second conveying module 32 (see FIG. 8). While wafer W (B3) is conveyed to turnout module 30, conveyance of wafers W (B4, B35) before application module 20 where the trouble occurs is temporarily stopped. Conveyance and processing of other wafers W are continued (FIG. 9, Step 9-10).

Figure 10:
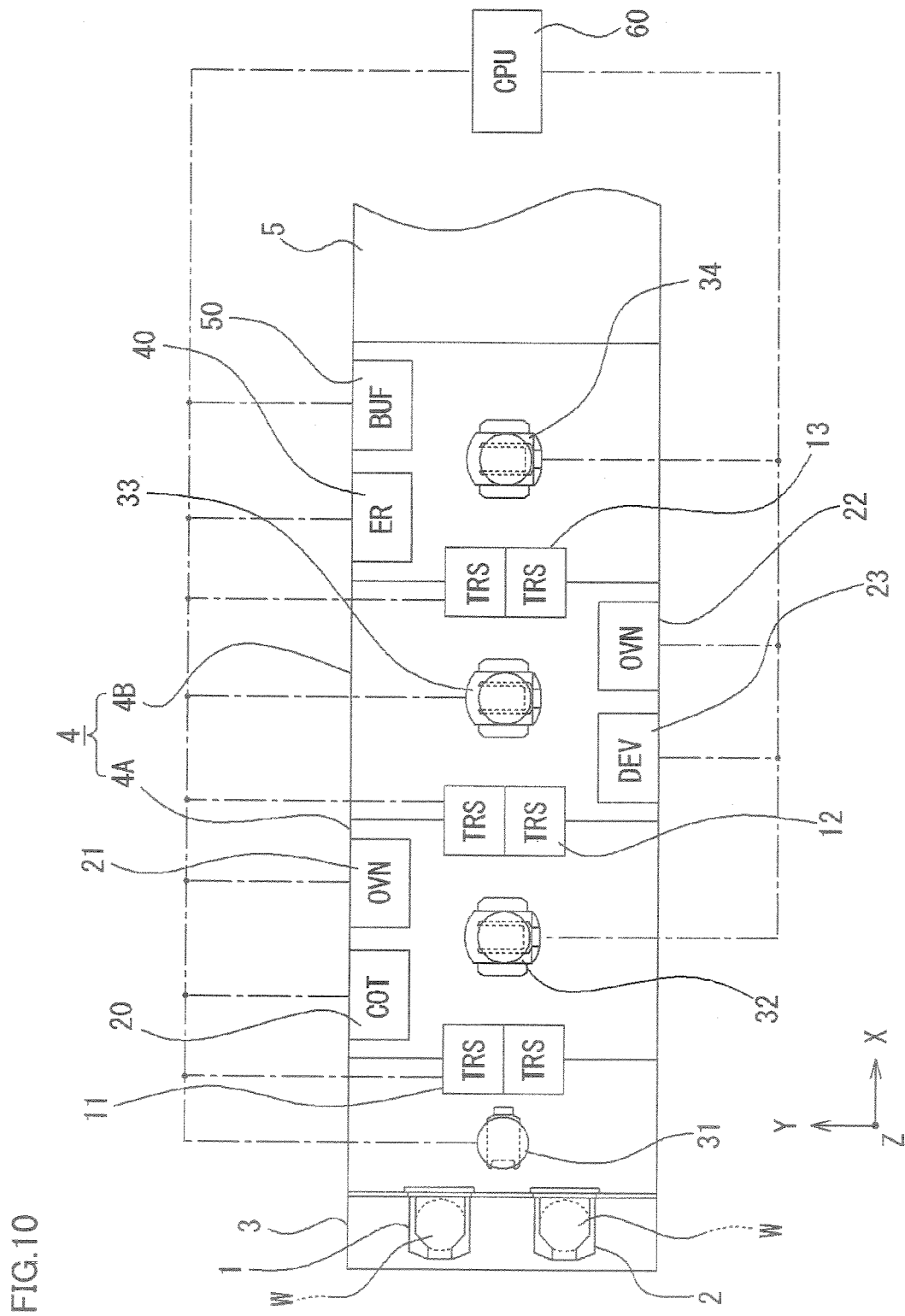
FIG. 10 is a schematic plan view showing a second embodiment of the resist application, exposure and development processing system having the substrate convey processing device according to the present invention.

In the above embodiment, description is made for a case where turnout module 30 is separately provided, however, as shown in FIG. 10, transfer modules 11, 12, 13 or buffer module 50, or a vacant module provided in the processing system may be used as a turnout module instead of separately provided turnout module 30. In FIG. 10, an identical part is denoted by the same symbol and description thereof will not be repeated because the present case is as same as the first embodiment except that turnout module is not separately provided.

For example, as described above, when a trouble occurs in wafer W which is being processed in one unit of application module 20, occurrence of trouble is detected (FIG. 9, Step 9-2) by a scanning signal of CPU 60, namely checking signal of conveyance exclusion (FIG. 9, Step 9-1). Then whether wafer is being conveyed to application module 20 of the conveyance destination (FIG. 9, Step 9-3). In this case, if wafer W is not conveyed to application module 20 by second conveying module 32, second transfer module 12 by which turnout module is shared is determined as the conveyance destination of wafer W (FIG. 9, Step 9-4). Then whether or not second transfer module 12 is useable is determined (FIG. 9, Step 9-6), and if second transfer module 12 is usable, in other words, second transfer module 12 is vacant, convey schedule is changed and the conveyance destination is changed to second transfer module 12 (FIG. 9, Step 9-7), and wafer W is conveyed to second transfer module by second conveying module 32. While wafer 7 is conveyed to second transfer module 12, conveyance of wafer 7 before application module 20 where the trouble occurs is temporarily stopped. Conveyance and processing of other wafers W are continued (FIG. 9, Step 9-10).

When a trouble occurs in module of before or after exposure process (for example, in circumference exposure module 40), buffer module 50 may be used as turnout module.

In a case where wafers W are conveyed to a plurality of process modules, and they are multiply processed by the process modules, a vacant process module may be used as a turnout module where there is a vacant process module. In this case, as a vacant process module, for example, an oven module or a cooling module may be used, and in a case of using a oven module, it is necessary to use an oven module which is not used and has temperature which is not elevated (temperature recipe is not transferred).

According to the processing system configured as described above, wafer W which is to be conveyed to a process module where a trouble occurs is conveyed to turnout module 30 (transfer module 11, 12, 13, buffer module 50, vacant module), conveyance of wafer W before the module where a trouble occurs is temporarily stopped, and conveyance and processing of wafer W after the module where a trouble occurs are continued, and thereafter conveyance and processing of wafer W before the module where a trouble occurs may be conducted. Therefore, even when a trouble occurs in part of modules, it is possible to execute conveyance and processing of wafer W smoothly, and to keep the cycle time control. In particular, even when a trouble occurs in a module situated between carrying-in cassette module 1 and exposure part 5, it is possible to prevent occurrence of time lag from exposure to post exposure bake (PED time), Also, it is possible to prevent wafer W processed in oven-series module from being over-baked.

By using existent first to third transfer modules 11 to 13 or buffer module 50 as a turnout module, it is possible to downsize the device.

In the above embodiment, description is made for a case where a substrate convey processing device, a trouble countermeasure method and a trouble countermeasures program are applied to a resist application and development processing system for wafer, however, they may be applied to application and development processing system for LCD glass substrate.

It is to be understood that the foregoing embodiments are in all respects illustrative and non-limitative. The scope of the present invention is defined only by attached claims and not by the above description, and any modifications within the meanings and ranges of equivalence and claims are embraced in the present invention.

The invention claimed is:
1. A substrate convey processing device comprising:
a carrying-in cassette module which accommodates a plurality of substrates;
a plurality of process modules which conducts predetermined processes on the substrate;
a carrying-out cassette module which accommodates the processed substrates;
conveying modules which convey the substrate between each of the process modules;
a turnout module from which the substrate is transferred to and from said conveying module; and
a controller which detects a trouble occurring in said process module, and centrally controls each of the modules based on a detection signal, wherein
the substrate is conveyed from said carrying-in cassette module to each of the process modules in a distributed manner by said conveying module,
the substrate is processed by each of the plurality of process modules in a distributed manner,
said plurality of process modules are grouped into a plurality of processing blocks,
said substrate conveying processing device further comprises transfer modules disposed for said plurality of processing blocks respectively for transferring the substrate between the processing blocks adjacent to each other via said conveying module, and
when said controller detects the trouble occurring in any one of the process modules, said controller is configured to determine whether or not the substrate which is originally determined by the controller to be conveyed from said conveying module to the process module where the trouble occurs can be held temporarily by said turnout module and, when said controller determines that said substrate can be held temporarily by said turnout module, said substrate is instead conveyed from said conveying module to said turnout module, conveyance of the substrates before the process module where the trouble occurs is temporarily stopped, and conveyance and processing of the other substrates are continued, and thereafter conveyance and processing of the substrates before the process module where the trouble occurs are conducted.

2. The substrate convey processing device according to claim 1, wherein
said turnout module is one of the transfer modules.

3. The substrate convey processing device according to claim 1, wherein
said turnout module is a buffer module disposed in one of the processing blocks, and capable of transferring the substrate in the processing block.

4. The substrate convey processing device according to claim 1, wherein conveyance is stopped until the process module is returned from trouble if the turnout module is not usable.

5. The substrate convey processing device according to claim 1, wherein the turnout module is disposed within one of the processing blocks.

6. The substrate convey processing device according to claim 5, wherein the turnout module is separate from the transfer modules.

7. The substrate convey processing device according to claim 1, wherein when said controller determines that said substrate cannot be held temporarily by said turnout module, conveyance of the substrate is stopped until the process module where the trouble occurs returns from trouble.

* * * * *